(12) United States Patent
Kusuyama (10) Patent No.: US 10,660,207 B2
(45) Date of Patent: May 19, 2020

(54) CIRCUIT MODULE AND METHOD FOR MANUFACTURING THE SAME

(71) Applicant: Murata Manufacturing Co., Ltd., Kyoto (JP)

(72) Inventor: Takafumi Kusuyama, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/565,912

(22) Filed: Sep. 10, 2019

(65) Prior Publication Data

US 2020/0008301 A1 Jan. 2, 2020

Related U.S. Application Data

(63) Continuation of application No. PCT/JP2018/009304, filed on Mar. 9, 2018.

(30) Foreign Application Priority Data

Mar. 14, 2017 (JP) ................. 2017-048908

(51) Int. Cl.
*H05K 1/18* (2006.01)
*H05K 3/10* (2006.01)
(Continued)

(52) U.S. Cl.
CPC ............. *H05K 1/181* (2013.01); *H05K 3/102* (2013.01); *H05K 3/38* (2013.01); *H05K 3/4632* (2013.01)

(58) Field of Classification Search
CPC ... H05K 1/181–188; H05K 3/102–103; H05K 3/4632
See application file for complete search history.

(56) References Cited

U.S. PATENT DOCUMENTS

2007/0278670 A1 12/2007 Kimura et al.
2008/0185704 A1* 8/2008 Hsu ................... H01L 23/49827
257/690
(Continued)

FOREIGN PATENT DOCUMENTS

JP 5790682 B2 10/2015
WO 2007/049458 A1 5/2007
WO 2014/188760 A1 11/2014

OTHER PUBLICATIONS

International Search Report for International Application No. PCT/JP2018/009304 dated May 22, 2018.
(Continued)

*Primary Examiner* — Hoa C Nguyen
(74) *Attorney, Agent, or Firm* — Pearne & Gordon LLP (57) ABSTRACT

A circuit module includes a substrate on which a first electrode and a second electrode are provided, a first electronic component, and a first resin layer. The first electrode includes a first electrode base body and a first plating film. The second electrode and the first electronic component are covered with the first resin layer. The second electrode includes a second electrode base body, a metal column, whose one end is directly connected to the second electrode base body and another end is positioned in an inner side relative to an outer surface of the first resin layer, a second plating film with a cylindrical shape covering a side surface of a connection body of the second electrode base body and the metal column, and a covering portion connected to the other end of the metal column.

21 Claims, 7 Drawing Sheets

(51) Int. Cl.
*H05K 3/38* (2006.01)
*H05K 3/46* (2006.01)

(56) References Cited

U.S. PATENT DOCUMENTS

| | | | |
|---|---|---|---|
| 2009/0026604 A1* | 1/2009 | Shin | H01L 21/4857 |
| | | | 257/702 |
| 2009/0065245 A1* | 3/2009 | Hsu | H01L 23/49822 |
| | | | 174/260 |
| 2012/0138346 A1* | 6/2012 | Uematsu | H05K 3/427 |
| | | | 174/255 |
| 2013/0050967 A1* | 2/2013 | Ohshima | H01L 23/49827 |
| | | | 361/764 |
| 2013/0307113 A1* | 11/2013 | Kunimoto | H01L 23/49827 |
| | | | 257/528 |
| 2014/0159222 A1* | 6/2014 | Hong | H01L 23/13 |
| | | | 257/686 |
| 2014/0262442 A1 | 9/2014 | Nomura et al. | |
| 2016/0073499 A1 | 3/2016 | Ogawa et al. | |
| 2017/0077043 A1* | 3/2017 | Takemura | C09D 183/14 |
| 2017/0154871 A1* | 6/2017 | Inagaki | H01L 23/49838 |

OTHER PUBLICATIONS

Written Opinion for International Application No. PCT/JP2018/009304 dated May 22, 2018.

* cited by examiner

CIRCUIT MODULE AND METHOD FOR MANUFACTURING THE SAME

This is a continuation of International Application No. PCT/JP2018/009304 filed on Mar. 9, 2018 which claims priority from Japanese Patent Application No. 2017-048908 filed on Mar. 14, 2017. The contents of these applications are incorporated herein by reference in their entireties.

BACKGROUND

Technical Field

The present disclosure relates to a circuit module and a method for manufacturing the same.

Circuit modules including a substrate, an electronic component connected to one main surface side of the substrate, an external connection terminal, and a resin layer provided on the one main surface side of the substrate are already known. As an example of such a circuit module, a circuit module disclosed in Japanese Patent No. 5790682 (Patent Document 1) can be cited.

Figure 11:
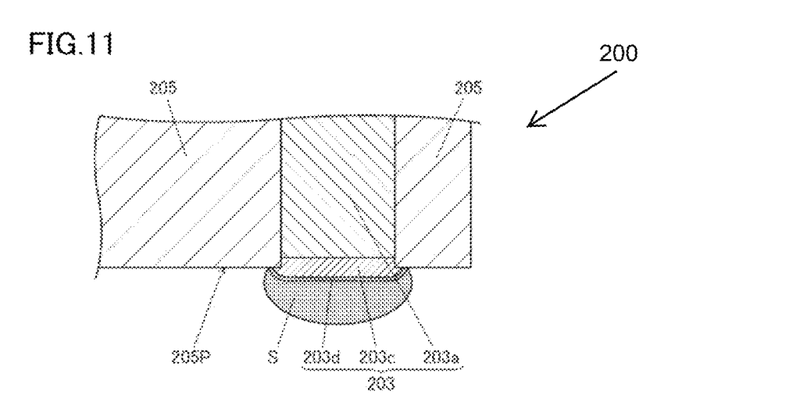
FIG. 11 is a cross-sectional view of a main part of a circuit module 200 in the background art.

FIG. 11 is a cross-sectional view of a main part of a circuit module 200 disclosed in Patent Document 1. The circuit module 200 includes an external connection terminal 203 and a resin layer 205 each provided on one main surface side of a substrate which is not illustrated. The external connection terminal 203 is arranged in the resin layer 205 such that one end thereof protrudes from a surface 205P of the resin layer 205.

The external connection terminal 203 includes a metal column 203a, a first covering portion 203c, and a second covering portion 203d. The metal column 203a is formed by, for example, a through-hole provided in the resin layer 205 being filled with a metal pin formed beforehand using Cu as a material or a conductive paste using Cu as a material and the filling being cured. As a material for the resin layer 205, for example, an epoxy resin is used.

One end of the metal column 203a is inside the resin layer 205. One end of the first covering portion 203c is connected to the one end of the metal column 203a, and the other end thereof protrudes from the surface 205P of the resin layer 205. The second covering portion 203d covers a surface of the first covering portion 203c. The first covering portion 203c is formed by plating, for example, by using Ni as a material. The second covering portion 203d is formed by plating, sputtering, vapor deposition, or the like, for example, by using Au as a material. A connection member S such as a solder bump is applied on a surface of the second covering portion 203d.

In the circuit module 200, by including the above-described configuration, since a stress acting on a connection interface between the external connection terminal 203 and the connection member S is alleviated, connection reliability of an electronic device to a mother substrate is described to be improved.

Patent Document 1: Japanese Patent No. 5790682

BRIEF SUMMARY

However, in the circuit module 200, in a case where the metal column 203a is formed of the metal pin, since surface smoothness thereof is high, there is a risk that compatibility with the resin layer 205 is insufficient. In addition, in a case where the metal column 203a is formed of the Cu paste with which the through-hole provided in the resin layer 205 is filled, since wettability between the Cu paste and the resin layer 205 is poor, there is the risk that the compatibility with the resin layer 205 is insufficient in the same manner. As a result, when the circuit module 200 is heated, due to a difference in thermal expansion or the like between the metal column 203a and the resin layer 205, there is a risk that separation occurs at an interface between the metal column 203a and the resin layer 205.

The present disclosure provides a circuit module in which separation at an interface between an external connection terminal and a resin layer is suppressed, and a method for manufacturing the same.

In a circuit module according to the present disclosure, a structure of an external connection terminal is improved.

The present disclosure is directed first to a circuit module.

A circuit module according to the present disclosure includes a substrate, a first electronic component, and a first resin layer. On one main surface of the substrate, a first electrode and a second electrode are provided. The second electrode corresponds to an external connection terminal. The first resin layer is provided on a side of the one main surface of the substrate. The first electronic component is connected to the first electrode, and arranged in the first resin layer such that a surface positioned on an opposite side from a surface on a side of the first electrode is at least partially exposed. The second electrode is arranged in the first resin layer such that one end of the second electrode is positioned in an outer side portion relative to an outer surface of the first resin layer. The first electrode includes a first electrode base body and a first plating film at least partially covering an outer surface of the first electrode base body. The second electrode includes a second electrode base body, a metal column, a second plating film, and a covering portion. The metal column has one end directly connected to the second electrode base body and another end positioned in an inner side portion relative to the outer surface of the first resin layer, and is formed by metal powder being sintered. The second plating film has a cylindrical shape, at least partially covers a side surface of a connection body of the second electrode base body and the metal column, and has one end on an identical surface to the other end of the metal column. Of the covering portion, one main surface is connected to the other end of the metal column and the one end of the second plating film and another main surface is positioned in the outer side portion relative to the outer surface of the first resin layer.

In the circuit module described above, the second electrode which is the external connection terminal includes the second plating film which at least partially covers the side surface of the connection body of the second electrode base body and the metal column formed by the metal powder being sintered. In this case, the second plating film and the first resin layer have good compatibility with each other, and a close contact property between the second plating film and the first resin layer is high. Accordingly, for example, even when the circuit module is heated, separation at an interface between the second electrode and the first resin layer is suppressed from occurring.

The circuit module according to the present disclosure can include the following features. That is, the metal column has a region in which an area of a cross section orthogonal to a normal direction of the one main surface of the substrate and an area of a connection portion between the metal column and the second electrode base body are different from each other.

In the circuit module described above, a contact area between the second electrode and the first resin layer increases in comparison with a case where the metal column has a mere columnar shape. Accordingly, the separation at the interface between the second electrode and the first resin layer is further suppressed from occurring. In addition, in a case where the shape of the metal column is a tree shape, an inverted tree shape, a barrel shape, a Japanese hand drum shape (a shape similar to an hourglass shape), or the like, and the area of the cross section orthogonal to the normal direction of the one main surface of the substrate does not simply change, the effect is particularly remarkably obtained.

The circuit module according to the present disclosure can include the following features. In other words, the surface of the first electronic component positioned on the opposite side from the surface on the side of the first electrode is configured of a polished cross section, and the outer surface of the first resin layer parallel to the one main surface of the substrate and the polished cross section of the first electronic component are flush with each other.

In the circuit module described above, for example, the first electronic component, such as an IC (Integrated Circuit), is connected to the first electrode and is then subjected to polishing process from the surface side that is positioned on the opposite side from the surface on the first electrode side. Accordingly, the circuit module is reduced in height without necessarily using a thin IC which is difficult to handle.

In one aspect of the present disclosure, the circuit module further includes a second electronic component mounted on another main surface of the substrate, and a second resin layer provided on a side of the other main surface of the substrate and covering the second electronic component.

In one aspect of the present disclosure, the second plating film is constituted of a metal material harder than a metal material constituting the metal column.

In one aspect of the present disclosure, an interface of the first resin layer positioned between the first resin layer and the metal column is covered with a metal material having higher corrosion resistance than that of the metal material constituting the metal column.

In one aspect of the present disclosure, the circuit module further includes a covering film that at least partially covers a side surface of the second plating film. The second plating film is constituted of a metal material having higher ductility than that of the metal material constituting the metal column. The covering film is constituted of a metal material having higher ductility than that of the metal material constituting the second plating film.

Furthermore, the present disclosure is also directed to a method for manufacturing a circuit module.

A method for manufacturing a circuit module according to the present disclosure is a method for manufacturing a circuit module including a substrate on one main surface of which a first electrode and a second electrode are provided, a first electronic component, and a first resin layer. The first electrode includes a first electrode base body and a first plating film. The second electrode includes a second electrode base body, a metal column which is a sintered body of metal powder, a second plating film, and a covering portion. The method for manufacturing the circuit module according to the present disclosure includes the following first to tenth steps.

The first step is a step of preparing or producing first constraining layer green sheets, second constraining layer green sheets, a first insulator green sheet, and second insulator green sheets. Each of the first constraining layer green sheets includes a through-hole filled with a conductor paste containing the metal powder which serves as part of the metal column after sintering. To the first insulator green sheet, a conductor paste which serves as the first electrode base body after sintering, a conductor paste which serves as the second electrode base body after sintering, and a conductor paste which serves as a constituent element of an electronic circuit after sintering are applied. To each of the second insulator green sheets, a conductor paste which serves as a constituent element of the electronic circuit after sintering is applied.

The second step is a step of producing a multilayer body by stacking and pressure-bonding at least one of the first constraining layer green sheets, at least one of the second constraining layer green sheets, the first insulator green sheet, and at least one of the second insulator green sheets. At this time, the stacking and pressure-bonding is performed in a state that positioning is performed such that a first constraining layer is present on a side of the one main surface and a second constraining layer is present on a side of another main surface of the substrate after sintering, and the metal column is directly connected onto the second electrode base body.

The third step is a step of producing a sintered body by firing the multilayer body. By this step, the sintered body is obtained in which the substrate, the first constraining layer present on the side of the one main surface of the substrate, and the second constraining layer present on the side of the other main surface of the substrate are included, and the metal column formed by the metal powder being sintered is directly connected onto the second electrode base body.

The fourth step is a step of removing the first constraining layer and the second constraining layer.

The fifth step is a step of simultaneously forming the first plating film at least partially covering an outer surface of the first electrode base body and the second plating film at least partially covering an outer surface of a connection body of the second electrode base body and the metal column.

The sixth step is a step of connecting the first electronic component to the first electrode.

The seventh step is a step of providing the first resin layer on the side of the one main surface of the substrate such that the first electronic component and the connection body after plating are entirely covered.

The eighth step is a step of performing polishing process on the first electronic component and the first resin layer from a surface side positioned on an opposite side from a surface of the first electronic component on a side of the first electrode. At this time, polish-processing is performed such that a thickness of the first electronic component is reduced in comparison with a state before being connected to the first electrode, and an outer surface which is a polished cross section of the first resin layer parallel to the one main surface of the substrate, a polished cross section of the first electronic component, and a polished cross section of the connection body are flush with one another.

The ninth step is a step of etching the polished cross section of the connection body such that a cross section being exposed of the connection body is positioned in an inner side portion relative to the outer surface of the first resin layer parallel to the one main surface of the substrate.

The tenth step is a step of forming the covering portion whose one main surface is connected onto the cross section of the connection body exposed after etching and another main surface is positioned in an outer side portion relative to the outer surface of the first resin layer parallel to the one main surface of the substrate.

In the method for manufacturing the circuit module described above, after the first electronic component and the connection body on the outer surface of which the second plating film is formed are covered with the first resin layer, the first electronic component, the first resin layer, and the connection body are subjected to polishing process. Accordingly, it is possible to efficiently obtain the circuit module capable of suppressing separation at an interface between the second electrode and the first resin layer from occurring, and reduced in height.

The method for manufacturing the circuit module according to the present disclosure can include the following features. That is, in the first step, the first constraining layer green sheets in each of which the through-hole having a tapered shape is filled with the conductor paste containing the metal powder which serves as part of the metal column after sintering are prepared or produced. In the second step, at least one of the first constraining layer green sheets is stacked and pressure-bonded such that a region in which an area of a cross section of the metal column after sintering orthogonal to a normal direction of the one main surface of the substrate is different from an area of a connection portion of the metal column and the second electrode base body is included.

In the method for manufacturing the circuit module described above, it is possible to efficiently manufacture the circuit module in which the separation at the interface between the second electrode and the first resin layer is further suppressed from occurring. Furthermore, it is possible to easily produce the metal column having a shape, such as a tree shape, an inverted tree shape, a barrel shape, a Japanese hand drum shape (a shape similar to an hourglass shape), or the like, in which the area of the cross section orthogonal to the normal direction of the one main surface of the substrate does not simply change, and with which the separation suppression effect is remarkably obtained.

In a circuit module according to the present disclosure, since a close contact property between a second plating film and a first resin layer is high, even when the circuit module is heated, it is possible to suppress separation at an interface between a second electrode and the first resin layer from occurring.

Furthermore, in a method for manufacturing a circuit module according to the present disclosure, it is possible to efficiently manufacture the circuit module capable of suppressing the separation at the interface between the second electrode and the first resin layer from occurring, and reduced in height.

DETAILED DESCRIPTION

Hereinafter, features of the present disclosure will be described in more detail through description of an embodiment of the present disclosure. The present disclosure can be applied to various circuit modules including a columnar external connection terminal for connection to a mother substrate of an electronic device. In particular, the present disclosure is effectively applied to a circuit module in which the external connection terminal is required to be thinly formed for miniaturization.

Embodiment of Circuit Module
<Structure of Circuit Module>

A structure of a circuit module 100, which is an embodiment of a circuit module according to the present disclosure, will be described with reference to FIG. 1 to FIG. 3.

Note that the drawings are respectively schematic diagrams, and dimensions of an actual product are not necessarily reflected. Additionally, variations in shapes of constituent elements or the like generated in manufacturing steps are not also necessarily reflected in the drawings. That is, hereinafter, the drawings used for description in this specification can be considered as representing the actual product in an essential aspect, even if there is a different part from that of the actual product.

Figure 1:
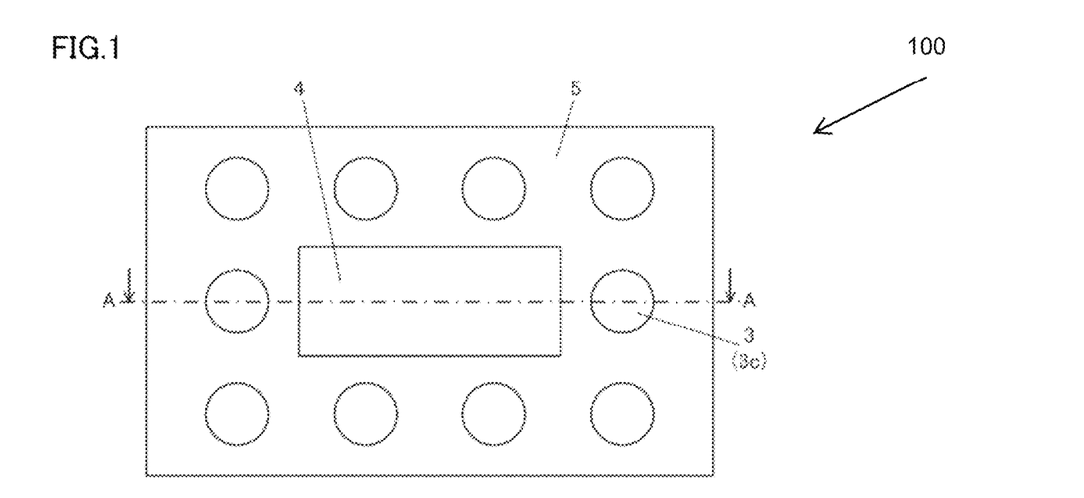
FIG. 1 is a bottom view of a circuit module 100 which is an embodiment of a circuit module according to the present disclosure.
Figure 2:
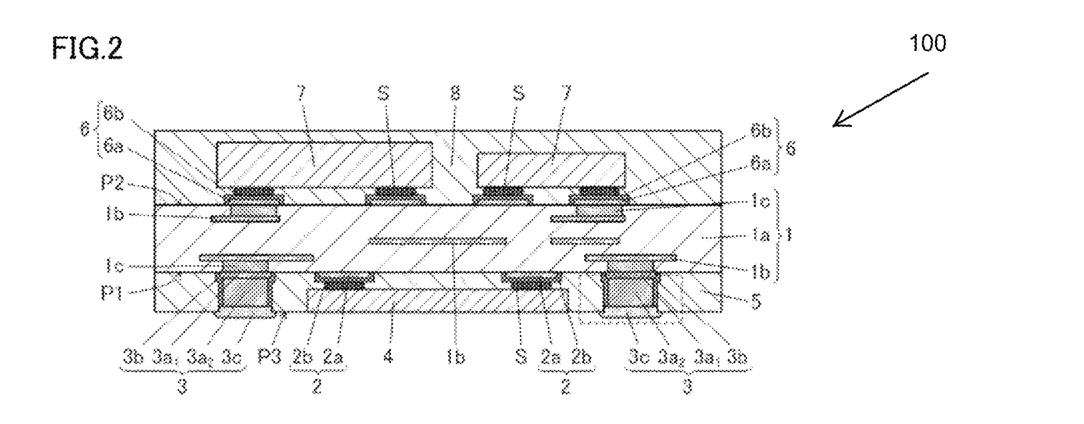
FIG. 2 is a cross-sectional view of the circuit module 100.

FIG. 1 is a bottom view of the circuit module 100 when viewed from a first resin layer 5 side in a normal direction of one main surface of a substrate 1. FIG. 2 is a cross-sectional view of the circuit module 100 when viewed in an arrow direction at a cut plane including a line A-A illustrated in FIG. 1. FIG. 3 is a cross-sectional view of a main part of the circuit module 100 obtained by enlarging an area surrounded by a dotted line in FIG. 2.

The circuit module 100 according to the present disclosure includes the substrate 1, a first electronic component 4, the first resin layer 5, a second electronic component 7, and a second resin layer 8. Note that the second electronic component 7 and the second resin layer 8 are not necessarily essential constituent elements in the circuit module 100 of some embodiments of the present disclosure. For the substrate 1, a first electrode 2 and a second electrode 3 are provided on one main surface P1 thereof, and a third electrode 6 is provided on the other main surface P2 thereof. Here, the second electrode 3 corresponds to an external connection terminal. The substrate 1 includes an insulator layer 1a, and a pattern conductor 1b and a via conductor 1c which are conductors necessary for configuring an electronic circuit.

That is, the substrate 1 is a ceramic multilayer substrate in which the insulator layer 1a is, for example, formed of a low temperature sintering ceramic material. However, the type of the insulator layer $1a$ is not limited thereto. The pattern conductor $1b$ and the via conductor $1c$ are formed using a metal material selected from Cu, a Cu alloy, and the like, for example. However, the material of the pattern conductor $1b$ and the via conductor $1c$ is not limited thereto.

The first electronic component 4 is connected to the first electrode 2 with a connection member S, and is arranged in the first resin layer 5 such that a surface positioned on an opposite side from a surface on the first electrode 2 side is exposed. The second electronic component 7 is connected to the third electrode 6 with the connection member S, and is entirely covered with the second resin layer 8.

The first electronic component 4 is, for example, an electronic component such as various types of ICs or a circuit module that is smaller than the circuit module 100. The second electronic component 7 is, for example, an electronic component such as a multilayer capacitor, a multilayer inductor, various types of filters, or various types of ICs. For the connection member S, for example, Sn—Ag—Cu based Pb-free solder is used. However, the material of the connection member S is not limited thereto.

The first electronic component 4 can be connected to the first electrode 2, and after being entirely covered with the first resin layer 5, subjected to polishing process from the surface side positioned on the opposite side from the surface on the first electrode 2 side. As a result, the first electronic component 4 is reduced in thickness in comparison with a state before being connected to the first electrode 2. In the first electronic component, the surface positioned on the opposite side from the surface on the first electrode side is configured of a polished cross section. Additionally, an outer surface P3 of the first resin layer 5 parallel to the one main surface of the substrate 1 and the polished cross section of the first electronic component 4 are flush with each other.

By configuring as described above, for example, when the first electronic component 4 is an IC, the circuit module 100 is reduced in height without necessarily using a thin IC which is difficult to handle.

The first resin layer 5 is provided on the one main surface P1 side of the substrate 1. The second resin layer 8 is provided on the other main surface P2 side of the substrate 1. Each of the first resin layer 5 and the second resin layer 8 is formed using a resin material in which a glass material, silica, or the like is dispersed as a filler. However, each of the first resin layer 5 and the second resin layer 8 may be formed of a single resin material. The first resin layer 5 and the second resin layer 8 may be formed by using any of the same resin material or different resin materials.

The first electrode 2 has a plate shape and includes a first electrode base body $2a$ and a first plating film $2b$ covering an outer surface of the first electrode base body $2a$. The second electrode 3 has a columnar shape and arranged in the first resin layer 5 such that one end thereof is positioned in an outer side portion relative to the outer surface P3 of the first resin layer 5. The second electrode 3 includes a second electrode base body $3a_1$, a metal column $3a_2$, a second plating film $3b$, and a covering portion $3c$. The third electrode 6 has a plate shape and includes a third electrode base body $6a$ and a third plating film $6b$ covering an outer surface of the third electrode base body $6a$.

Figure 3:
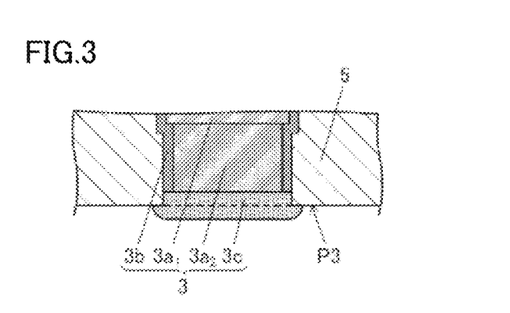
FIG. 3 is a cross-sectional view of a main part of the circuit module 100.

The metal column $3a_2$ has a simple columnar shape in which one end thereof is directly connected to the second electrode base body $3a_1$ and the other end thereof is positioned in an inner side portion relative to the outer surface P3 of the first resin layer 5 (see FIG. 3). Here, the fact that the one end of the metal column $3a_2$ is directly connected to the second electrode base body $3a_1$ refers to being in a state of an integrated connection body, for example, by sintering or the like without necessarily using a connection member such as solder. That is, the metal column $3a_2$ is formed by metal powder being sintered.

The second plating film $3b$ has a cylindrical shape, at least partially covers a side surface of a connection body of the second electrode base body $3a_1$ and the metal column $3a_2$, and has one end on an identical surface to the other end of the metal column $3a_2$. In the covering portion $3c$, one main surface thereof is connected to the other end of the metal column $3a_2$ and the one end of the second plating film $3b$, and the other main surface thereof is positioned in the outer side portion relative to the outer surface P3 of the first resin layer 5 (see FIG. 3). Note that a fourth plating film (not illustrated) may be further provided on an outer surface of the covering portion $3c$.

Each of the first electrode base body $2a$, the second electrode base body $3a_1$, the metal column $3a_2$, and the third electrode base body $6a$ is formed using a metal material selected from Cu, a Cu alloy, and the like, for example. As the Cu alloy, for example, a Cu-10Ni alloy or the like may be used. However, the material of each of the first electrode base body $2a$, the second electrode base body $3a_1$, the metal column $3a_2$, and the third electrode base body $6a$ is not limited thereto. Each of the first plating film $2b$, the second plating film $3b$, the third plating film $6b$, and the covering portion $3c$ is formed using a metal material selected from Ni, a Ni alloy, and the like, for example.

In a case where the fourth plating film is provided, the fourth plating film is formed using a metal material selected from Sn, an Sn alloy, and the like, for example.

In the circuit module 100, the second electrode 3 which is the external connection terminal includes the second plating film $3b$ which at least partially covers the side surface of the connection body of the second electrode base body $3a_1$ and the metal column $3a_2$. In this case, the second plating film $3b$ and the first resin layer 5 have good compatibility with each other, and a close contact property between the second plating film $3b$ and the first resin layer 5 is high. Accordingly, for example, even when the circuit module 100 is heated, separation at an interface between the second electrode 3 and the first resin layer 5 is suppressed from occurring.

<Modifications of Second Electrode>

Figure 4A:
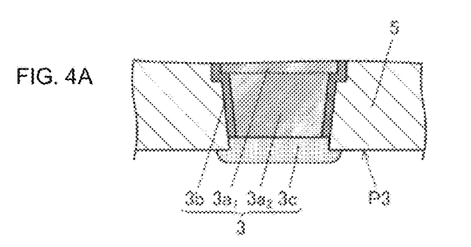
FIGS. 4A-4F include cross-sectional views for explaining various modifications of a second electrode 3 of the circuit module 100.
Figure 4B:
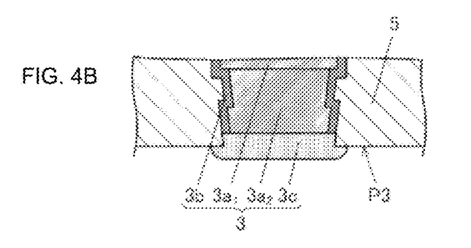

FIGS. 4A-4F include cross-sectional views for explaining various modifications of the second electrode 3 of the circuit module 100. FIG. 4A illustrates a case where the metal column $3a_2$ has a tapered shape in which a cross-sectional area continuously decreases from the one end (a connection portion with the second electrode base body $3a_1$) of the metal column $3a_2$ to the other end (a connection portion with the covering portion $3c$) of the metal column $3a_2$. FIG. 4B illustrates a case where the metal column $3a_2$ has an inverted tree shape on the diagram.

Figure 4C:
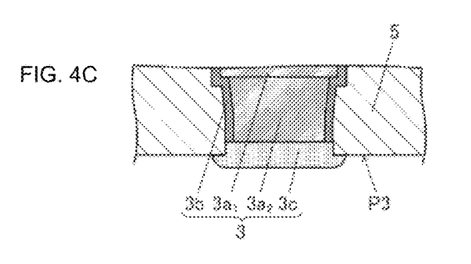
Figure 4D:
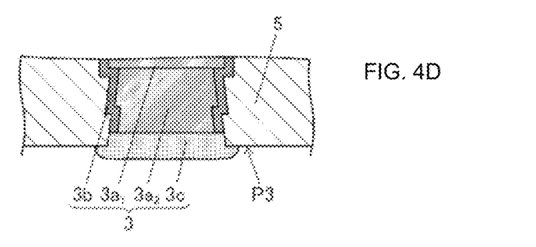

FIG. 4C illustrates a case where the metal column $3a_2$ has a shape in which the cross-sectional area continuously decreases from the one end to the middle portion of the metal column $3a_2$, and has a simple columnar shape from the middle portion to the other end of the metal column $3a_2$. FIG. 4D illustrates a case where the metal column $3a_2$ has a tree shape on the diagram.

Figure 4E:
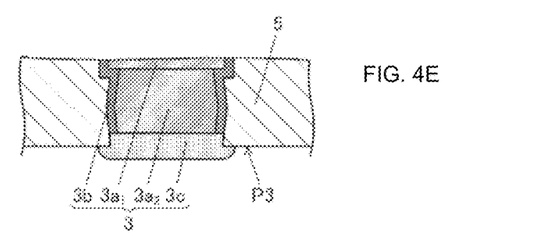
Figure 4F:
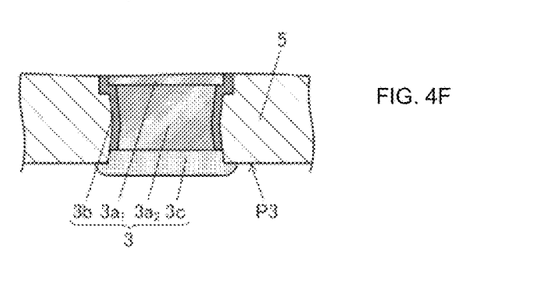

FIG. 4E illustrates a case where the metal column $3a_2$ has a barrel shape as a whole by the cross-sectional area continuously increasing from the one end to the middle portion of the metal column $3a_2$, and the cross-sectional area continuously decreasing from the middle portion to the other end of the metal column $3a_2$. FIG. 4F illustrates a case where the metal column $3a_2$ has a Japanese hand drum shape (a shape similar to an hourglass shape) as a whole by the cross-sectional area continuously decreasing from the one end to the middle portion of the metal column $3a_2$, and the cross-sectional area continuously increasing from the middle portion to the other end of the metal column $3a_2$.

That is, the metal column $3a_2$ according to each of the modifications has a region in which an area of a cross section orthogonal to a normal direction of the one main surface of the substrate 1 is different from an area of the connection portion between the metal column $3a_2$ and the second electrode base body $3a_1$.

In a case where the metal column $3a_2$ has such a shape, in comparison with a case of a mere columnar shape, a contact area between the second electrode 3 and the first resin layer 5 increases. Accordingly, the separation at the interface between the second electrode 3 and the first resin layer 5 is further suppressed from occurring. In addition, in a case where the shape of the metal column $3a_2$ is the tree shape, the inverted tree shape, the barrel shape, the Japanese hand drum shape (a shape similar to an hourglass shape), or the like, as described above, and the area of the cross section orthogonal to the normal direction of the one main surface of the substrate 1 does not simply change, the effect is particularly remarkably obtained.

<Method for Manufacturing Circuit Module>

FIGS. 5A to 8C are diagrams for explaining an example of a method for manufacturing the circuit module 100 which is the embodiment of the circuit module according to the present disclosure. FIGS. 5A to 5D, FIGS. 6A to 6D, FIGS. 7A to 7D, and FIGS. 8A to 8C are cross-sectional views respectively schematically illustrating steps sequentially performed in the example of the method for manufacturing the circuit module 100. Note that each of FIGS. 5A 8C corresponds to a cross-sectional view of the circuit module 100 when viewed in an arrow direction at the cut plane including the line A-A illustrated in FIG. 1 (see FIG. 2).

Furthermore, in the following method for manufacturing, a case where the circuit module 100 is once produced in an aggregated state and then is divided into individual pieces is described. However, in the drawings used in the description, the reference numerals attached to constituent elements of the circuit module 100 in the state of being divided into individual pieces are used, and the aggregated state and the state of being divided into individual pieces are not particularly distinguished from each other.

Figure 5A:
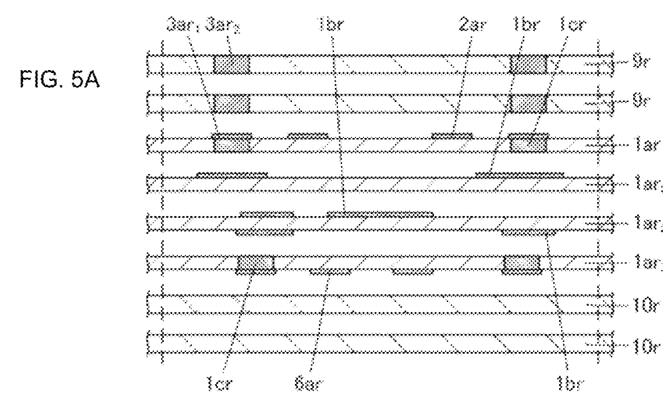
FIGS. 5A-5D include diagrams for explaining an example of a method for manufacturing the circuit module 100, and includes cross-sectional views for partially schematically explaining steps.

FIG. 5A is a cross-sectional view illustrating a step (first step) of preparing or producing a first constraining layer green sheet $9r$, a second constraining layer green sheet $10r$, a first insulator green sheet $1ar_1$, a second insulator green sheet $1ar_2$, and a third insulator green sheet $1ar_3$.

The first constraining layer green sheet $9r$ includes a through-hole filled with a conductor paste $3ar_2$ containing the metal powder which serves as part of the metal column $3a_2$ after sintering. The second constraining layer green sheet $10r$ is not particularly limited.

The first constraining layer green sheet $9r$ and the second constraining layer green sheet $10r$ include low temperature sintering ceramic material powder which is the same as low temperature sintering ceramic material powder constituting the insulator layer $1a$, and sintering-resistant ceramic material powder which is not sintered at a sintering temperature of the low temperature sintering ceramic material powder. As the sintering-resistant ceramic material powder, $Al_2O_3$ powder is used, for example. The conductor paste $3ar_2$ is obtained by dispersing Cu powder, which is a conductive material, in a resin material which is a binder. The through-hole is filled with the conductor paste $3ar_2$ through a known technique such as screen printing.

The first insulator green sheet $1ar_1$, the second insulator green sheet $1ar_2$, and the third insulator green sheet $1ar_3$, each includes the low temperature sintering ceramic material powder constituting the insulator layer $1a$.

To the first insulator green sheet $1ar_1$, a conductor paste $2ar$, a conductor paste $3ar_1$, and a conductor paste $1cr$ are applied. The conductor paste $2ar$ serves as the first electrode base body $2a$ after sintering. The conductor paste $3ar_1$ serves as the second electrode base body $3a_1$ after sintering. The conductor paste $1cr$ serves as a constituent element of an electronic circuit after sintering. To the second insulator green sheet $1ar_2$, conductor pastes $1br$ and $1cr$, each of which serves as a constituent element of the electronic circuit after sintering are applied.

To the third insulator green sheet $1ar_3$, the conductor paste $1cr$ and a conductor paste $6ar$ are applied. The conductor paste $6ar$ serves as the third electrode base body $6a$ after sintering. Note that in a case where the second electronic component 7 is not included in the circuit module 100, preparation or production of the third insulator green sheet $1ar_3$ is omitted.

The conductor pastes $1br$, $1cr$, $2ar$, $3ar_1$, and $6ar$ are each obtained by dispersing Cu powder, which is a conductive material, in a resin material which is a binder. The conductor pastes $1br$, $2ar$, $3ar_1$, and $6ar$ are applied to the first insulator green sheet $1ar_1$, the second insulator green sheet $1ar_2$, and the third insulator green sheet $1ar_3$ through a known technique such as screen printing.

Figure 5B:
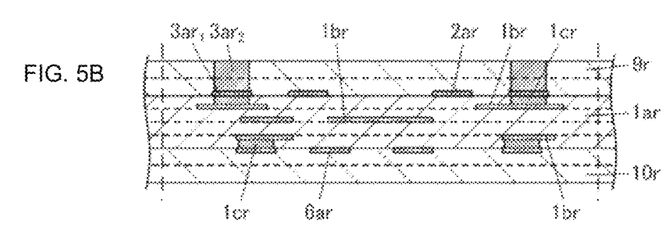

FIG. 5B is a cross-sectional view illustrating a step (second step) of producing a multilayer body by stacking and pressure-bonding at least one first constraining layer green sheet $9r$, at least one second constraining layer green sheet $10r$, the first insulator green sheet $1ar_1$, at least one second insulator green sheet $1ar_2$, and the third insulator green sheet $1ar_3$. At this time, the stacking and pressure-bonding is performed in a state that positioning is performed such that a first constraining layer 9 is present on the one main surface P1 side and a second constraining layer 10 is present on the other main surface P2 side of the substrate 1 after sintering, and the metal column $3a_2$ is directly connected onto the second electrode base body $3a_1$.

Figure 5C:
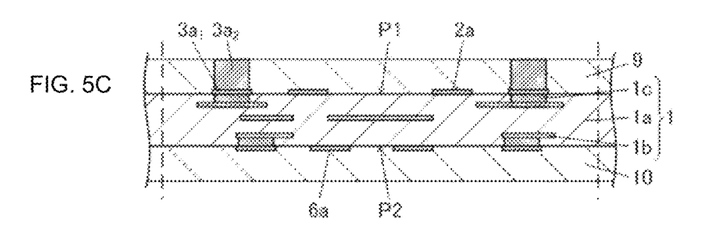

FIG. 5C is a cross-sectional view illustrating a step (third step) of producing a sintered body by firing the multilayer body described above. By this step, the sintered body is obtained in which the substrate 1, the first constraining layer 9 present on the one main surface P1 side of the substrate 1, and the second constraining layer 10 present on the other main surface P2 side of the substrate 1 are included, and the metal column $3a_2$ formed by the metal powder in the conductor paste $3ar_2$ being sintered is directly connected onto the second electrode base body $3a_1$.

Figure 5D:
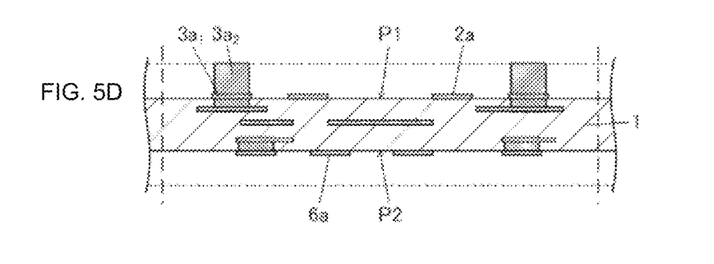

FIG. 5D is a cross-sectional view illustrating a step (fourth step) of removing the first constraining layer 9 from the one main surface P1 side of the substrate 1 and removing the second constraining layer 10 from the other main surface P2 side of the substrate 1. The removal of the first constraining layer 9 and the second constraining layer 10 can be carried out through a known technique such as sandblast, for example.

Figures 6A, 6B:
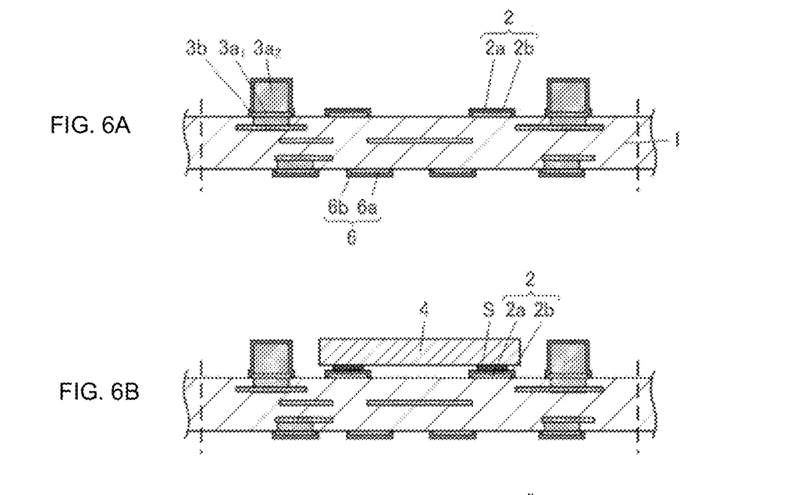
FIGS. 6A-6D include diagrams for explaining the example of the method for manufacturing the circuit module 100, and includes cross-sectional views for schematically explaining steps subsequent to those in FIGS. 5A-5D.

FIG. 6A is a cross-sectional view illustrating a step (a fifth step) of simultaneously forming the first plating film $2b$ covering the outer surface of the first electrode base body $2a$, the second plating film $3b$ covering the outer surface of the connection body of the second electrode base body $3a_1$ and the metal column $3a_2$, and the third plating film $6b$ covering the outer surface of the third electrode base body 6a. The first plating film 2b, the second plating film 3b, and the third plating film 6b can be formed through a known electroless plating method. By this step, the first electrode 2 and the third electrode 6 are produced.

FIG. 6B is a cross-sectional view illustrating a step (sixth step) of connecting the first electronic component 4 to the first electrode 2 by using the connection member S. As the connection member S, for example, a solder bump having the above-described Pb-free solder composition can be used. The solder bump is applied to, for example, the first electronic component 4 side. Then, by applying ultrasonic vibration to the first electronic component 4, the solder bump is connected to the first electrode 2.

Figure 6C:
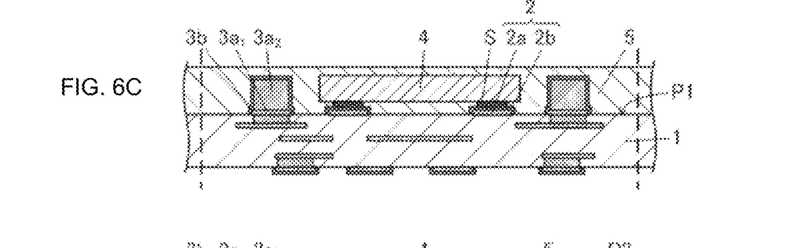

FIG. 6C is a cross-sectional view illustrating a step (seventh step) of providing the first resin layer 5 on the one main surface P1 side of the substrate 1 such that the first electronic component 4 and the connection body of the second electrode base body $3a_1$ and the metal column $3a_2$ after plating are entirely covered. The step of covering the first electronic component 4 and the connection body after plating with the first resin layer 5 can be performed through a known technique such as coating or the like on the one main surface P1 side of the substrate 1 with the resin material forming the first resin layer 5, for example.

Figure 6D:
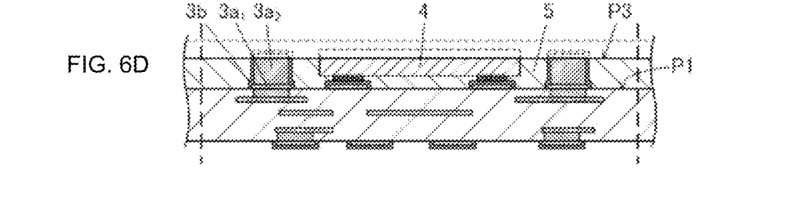

FIG. 6D is a cross-sectional view illustrating a step (eighth step) of performing polishing process on the first electronic component 4 and the first resin layer 5 from the surface side positioned on the opposite side from the surface of the first electronic component 4 on the first electrode 2 side. At this time, polish-processing is performed such that a thickness of the first electronic component 4 is reduced in comparison with a state before being connected to the first electrode 2, and the outer surface P3 which is the polished cross section of the first resin layer 5 parallel to the one main surface P1 of the substrate 1, the polished cross section of the first electronic component 4, and the polished cross section of the connection body after plating described above are flush with one another. The polishing process can be performed through a known technique such as lap polishing.

Figure 7A:
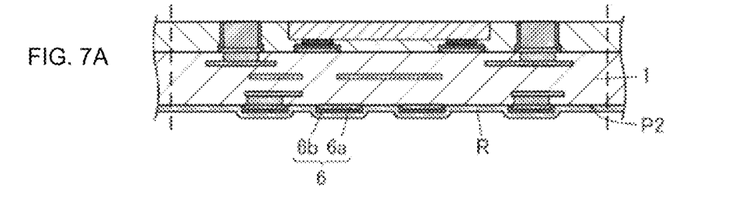
FIGS. 7A-7D include diagrams for explaining the example of the method for manufacturing the circuit module 100, and includes cross-sectional views for schematically explaining steps subsequent to those in FIGS. 6A-6D.

FIG. 7A is a cross-sectional view illustrating a step of applying a resist R onto the other main surface P2 of the substrate 1 so as to cover the third electrode 6. The resist R can be applied onto the other main surface P2 of the substrate 1 through a known technique such as a screen-printing method, for example. This step is performed in order to prevent the third electrode 6 from being etched when a step (ninth step) of etching the polished cross section of the connection body after plating described later is performed. Accordingly, this step is not performed when the second electronic component 7 is not included in the circuit module 100 and there is no third electrode 6 for connecting the second electronic component 7.

Figure 7B:
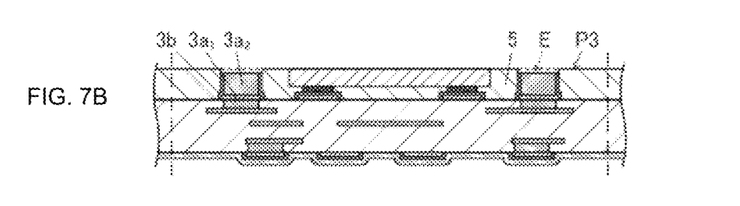

FIG. 7B is a cross-sectional view illustrating the step (ninth step) of etching the polished cross section of the connection body such that the exposed cross section of the connection body after plating described above is positioned in the inner side portion relative to the outer surface P3 of the first resin layer 5. By this step, the metal column $3a_2$ and the second plating film 3b are etched. Then, the exposed cross section of the connection body after plating moves to the inner side portion relative to the outer surface P3 of the first resin layer 5 by an amount equivalent to an etching region E.

Figure 7C:
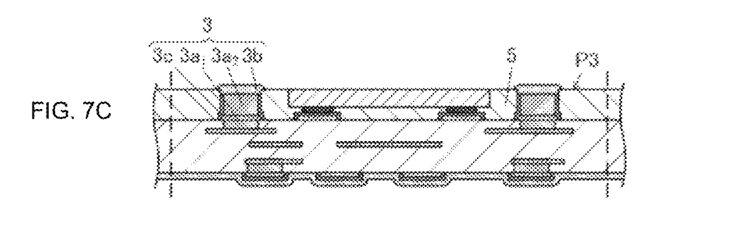

FIG. 7C is a cross-sectional view illustrating a step (tenth step) of forming the covering portion 3c (see FIG. 3) whose one main surface is connected onto the cross section of the connection body exposed after etching and whose other main surface is positioned in the outer side portion relative to the outer surface P3 of the first resin layer 5. The covering portion 3c can be formed through a known electroless plating method. By this step, the second electrode 3 having the aforementioned constituent elements is produced.

Figure 7D:
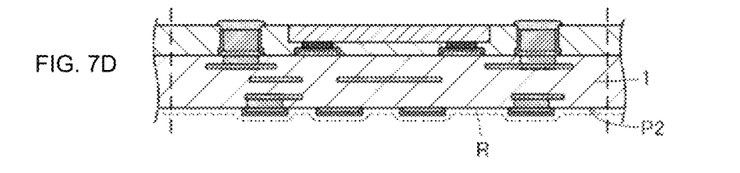

FIG. 7D is a cross-sectional view illustrating a step of removing the resist R covering the third electrode 6 from the other main surface P2 of the substrate 1. The resist R can be removed through a known technique such as dissolution or the like with a solvent. This step is performed in order to remove the resist R applied for the purpose of protecting the third electrode 6 before the step (ninth step) of etching the polished cross section of the connection body after plating described above. Accordingly, this step is not performed when the second electronic component 7 is not included in the circuit module 100 and there is no third electrode 6 for connecting the second electronic component 7.

Figure 8A:
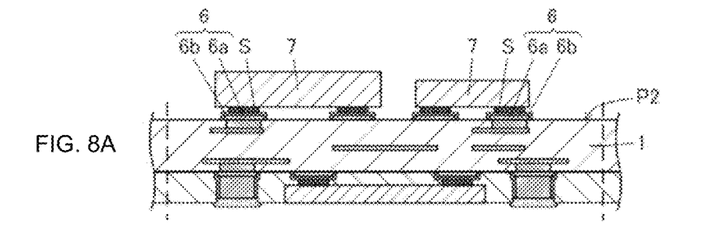
FIGS. 8A-8C include diagrams for explaining the example of the method for manufacturing the circuit module 100, and includes cross-sectional views for schematically explaining steps subsequent to those in FIGS. 7A-7D.

FIG. 8A is a cross-sectional view illustrating a step of connecting the second electronic component 7 to the third electrode 6 by using the connection member S. As the connection member S, for example, a solder bump having the above-described Pb-free solder composition can be used. The solder bump is applied to, for example, the second electronic component 7 side. Then, by applying ultrasonic vibration to the second electronic component 7, the solder bump is connected to the third electrode 6. This step is not performed when the second electronic component 7 is not included in the circuit module 100.

Figure 8B:
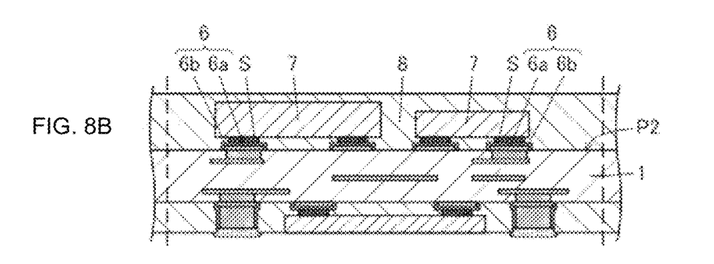

FIG. 8B is a cross-sectional view illustrating a step of providing the second resin layer 8 on the other main surface P2 side of the substrate 1 such that the second electronic component 7 is entirely covered. The step of covering the second electronic component 7 with the second resin layer 8 can be performed through a known technique such as coating or the like on the one main surface P1 side of the substrate 1 with the resin material forming the first resin layer 5, for example. By this step, the circuit module 100 in the aggregated state is produced. This step is not performed when the second electronic component 7 is not included in the circuit module 100 and there is no second resin layer 8 for covering the second electronic component 7.

Figure 8C:
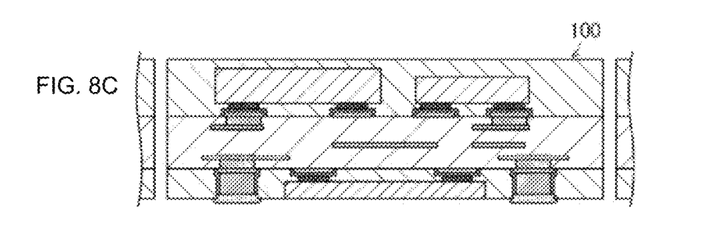

FIG. 8C is a cross-sectional view illustrating a step of cutting the aggregation of the circuit modules 100. By this step, the circuit module 100 according to the present disclosure is produced. Note that in a case where the circuit module 100 is manufactured in a state of being divided into the individual peace from the beginning, this step is not performed.

In the above-described method for manufacturing the circuit module 100, after the first electronic component 4 and the connection body on the outer surface of which the second plating film 3b is formed are covered with the first resin layer 5, the first electronic component 4, the first resin layer 5, and the connection body are subjected to polishing process. Accordingly, it is possible to efficiently obtain the circuit module 100 capable of suppressing the separation at the interface between the second electrode 3 and the first resin layer 5 from occurring, and reduced in height.

In the above-described method for manufacturing the circuit module 100, the following features can be included. In the first step, the first constraining layer green sheet 9r in which the through-hole having a tapered shape is filled with the conductor paste $3ar_2$ containing the metal powder which serves as part of the metal column $3a_2$ after sintering is prepared or produced. In the second step, at least one first constraining layer green sheet 9r described above is stacked and pressure-bonded such that the region in which the area of the cross section of the metal column $3a_2$ after sintering orthogonal to the normal direction of the one main surface P1 of the substrate 1 is different from the area of the connection portion of the metal column $3a_2$ and the second electrode base body $3a_1$ is included.

That is, the first constraining layer green sheet $9r$ is stacked while adjusting an orientation of the conductor paste $3ar_2$ formed to have the tapered shape as described above such that the metal column $3a_2$ after sintering has a desired shape.

In the method for manufacturing the circuit module 100 having the features described above, it is possible to efficiently manufacture the circuit module 100 in which the separation at the interface between the second electrode 3 and the first resin layer 5 is further suppressed from occurring. Furthermore, it is possible to easily produce the metal column $3a_2$ having the various shapes, such as the tree shape, the inverted tree shape, the barrel shape, the Japanese hand drum shape (a shape similar to an hourglass shape), or the like, as illustrated in FIG. 4, and having a shape in which the area of the cross section orthogonal to the normal direction of the one main surface of the substrate 1 does not simply change and with which the separation suppression effect is remarkably obtained.

Figure 9:
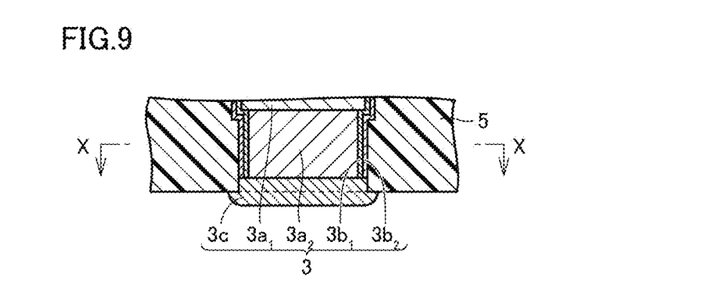
FIG. 9 is a longitudinal cross-sectional view of the second electrode which further includes a covering film.
Figure 10:
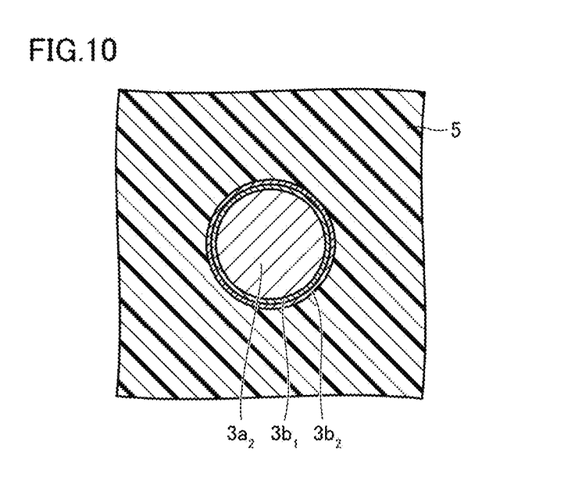
FIG. 10 is a transverse cross-sectional view of the second electrode of FIG. 9 when viewed from a direction of arrows on a line X-X.

Note that the second electrode 3 may further include a covering film $3b_2$ for at least partially covering a side surface of a second plating film $3b_1$. FIG. 9 is a longitudinal cross-sectional view of the second electrode which further includes the covering film. FIG. 10 is a transverse cross-sectional view of the second electrode of FIG. 9 when viewed from a direction of arrows on a line X-X.

As illustrated in FIG. 9 and FIG. 10, the second electrode 3 according to the present modification includes the second electrode base body $3a_1$, the metal column $3a_2$, the second plating film $3b_1$, the covering film $3b_2$, and the covering portion $3c$. The covering film $3b_2$ has a cylindrical shape, at least partially covers an outer circumferential surface of the second plating film $3b_1$, and has one end on an identical surface to the other end of the metal column $3a_2$. The one main surface of the covering portion $3c$ is connected to the other end of the metal column $3a_2$, the one end of the second plating film $3b_1$, and one end of the covering film $3b_2$.

In the present modification, the second plating film $3b_1$ covers the entire circumferential surface of the connection body of the second electrode base body $3a_1$ and the metal column $3a_2$. The covering film $3b_2$ covers the entire outer circumferential surface of the second plating film $3b_1$.

The second plating film $3b_1$ is constituted of a metal material having higher ductility than that of the metal material constituting the metal column $3a_2$. The covering film $3b_2$ is constituted of a metal material having higher ductility than that of the metal material constituting the second plating film $3b_1$.

For example, the metal column $3a_2$ is constituted of a metal material selected from Cu, a Cu alloy, and the like, the second plating film $3b_1$ is constituted of a metal material selected from Ni, an Ni alloy, and the like, and the covering film $3b_2$ is constituted of a metal material selected from Au, an Au alloy, and the like. Note that the metal materials respectively constituting the metal column $3a_2$, the second plating film $3b_1$, and the covering film $3b_2$ are not limited to those described above, and it is sufficient that the covering film $3b_2$, the second plating film $3b_1$, the metal column $3a_2$ are respectively constituted of metal materials having higher ductility in this order.

According to the configuration described above, in the second electrode 3, since metal materials having higher ductility are arranged in order from the side close to the first resin layer 5, when a stress is generated between the first resin layer 5 and the second electrode 3, the stress can be alleviated by the metal material having high ductility positioned in the vicinity of the first resin layer 5, and thus, it is possible to suppress the second electrode 3 from breaking by the stress being applied to the second electrode 3.

Note that the interface of the first resin layer 5 positioned between the first resin layer 5 and the metal column $3a_2$ may be covered with a metal material having higher corrosion resistance than that of the metal material constituting the metal column $3a_2$. In a case where the second electrode 3 includes the covering film $3b_2$, the covering film $3b_2$ is constituted of a metal material having higher corrosion resistance than that of the metal material constituting the metal column $3a_2$, and in a case where the second electrode 3 does not include the covering film $3b_2$, the second plating film $3b_1$ is constituted of a metal material having higher corrosion resistance than that of the metal material constituting the metal column $3a_2$. As the metal material having higher corrosion resistance than that of the metal material constituting the metal column $3a_2$, a noble metal such as Au, Ag, Pt, or the like, or an alloy thereof can be used.

In a case where the interface of the first resin layer 5 positioned between the first resin layer 5 and the metal column $3a_2$ is covered with the metal material having higher corrosion resistance than that of the metal material constituting the metal column $3a_2$, it is possible to suppress moisture, gas, or the like from entering into the inside of the circuit module 100 from the interface between the second electrode 3 and the first resin layer 5. As a result, it is possible to suppress the circuit module 100 from deteriorating in characteristics.

The second plating film $3b_1$ can be constituted of a metal material harder than the metal material constituting the metal column $3a_2$, from a viewpoint that the metal column $3a_2$ during polishing process in the eighth step can be suppressed from sagging. As a material constituting the second plating film $3b_1$, for example, a metal such as Ni, Ti, W, Co, or the like, or an alloy thereof can be used. Note that the hardness of the above-described metal material is the Vickers hardness.

It should be noted that the embodiments described in this specification are exemplary, the present disclosure is not limited to the embodiments described above, and various applications and modifications can be added within the scope of the present disclosure.

REFERENCE SIGNS LIST

100 CIRCUIT MODULE
1 SUBSTRATE
1a INSULATOR LAYER
1b PATTERN CONDUCTOR
1c VIA CONDUCTOR
2 FIRST ELECTRODE
2a FIRST ELECTRODE BASE BODY
2b FIRST PLATING FILM
3 SECOND ELECTRODE (EXTERNAL CONNECTION TERMINAL)
$3a_1$ SECOND ELECTRODE BASE BODY
$3a_2$ METAL COLUMN
$3b$, $3b_1$ SECOND PLATING FILM
$3b_2$ COVERING FILM
$3c$ COVERING PORTION

4 FIRST ELECTRONIC COMPONENT
5 FIRST RESIN LAYER
6 THIRD ELECTRODE
6a THIRD ELECTRODE BASE BODY
6b THIRD PLATING FILM
7 SECOND ELECTRONIC COMPONENT
8 SECOND RESIN LAYER
P1 ONE MAIN SURFACE
P2 THE OTHER MAIN SURFACE
P3 OUTER SURFACE OF FIRST RESIN LAYER PARALLEL TO ONE MAIN SURFACE OF SUBSTRATE
S CONNECTION MEMBER

The invention claimed is:

1. A circuit module comprising:
a substrate on one main surface of which a first electrode and a second electrode are provided;
a first electronic component; and
a first resin layer,
wherein the first resin layer is provided on the one main surface of the substrate,
the first electronic component is connected to the first electrode, and arranged in the first resin layer such that a surface of the first electronic component positioned on an opposite side from a surface connected to the first electrode is at least partially exposed,
the second electrode is arranged in the first resin layer such that one end of the second electrode is positioned in an outer side portion relative to an outer surface of the first resin layer,
the first electrode includes
a first electrode base body, and
a first plating film at least partially covering an outer surface of the first electrode base body,
the second electrode includes
a second electrode base body,
a metal column, whose one end is directly connected to the second electrode base body and another end is positioned in an inner side portion relative to the outer surface of the first resin layer, the metal column comprising sintered metal powder,
a second plating film with a cylindrical shape, at least partially covering a side surface of a connection body of the second electrode base body and the metal column, and having one end flush with the other end of the metal column, and
a covering portion whose one main surface is connected to the other end of the metal column and the one end of the second plating film and another main surface is positioned in the outer side portion relative to the outer surface of the first resin layer.

2. The circuit module according to claim 1,
wherein the metal column has a region in which an area of a cross section orthogonal to a normal direction of the one main surface of the substrate and an area of a connection portion between the metal column and the second electrode base body are different from each other.

3. The circuit module according to claim 2,
wherein the surface of the first electronic component positioned on the opposite side from the surface on the side of the first electrode is configured of a polished cross section, and the outer surface of the first resin layer parallel to the one main surface of the substrate and the polished cross section of the first electronic component are flush with each other.

4. The circuit module according to claim 2, the circuit module further comprising:
a second electronic component mounted on the other main surface of the substrate, and
a second resin layer provided on the other main surface of the substrate and covering the second electronic component.

5. The circuit module according to claim 2,
wherein the second plating film is constituted of a metal material harder than a metal material constituting the metal column.

6. The circuit module according to claim 2,
wherein an interface of the first resin layer positioned between the first resin layer and the metal column is covered with a metal material having higher corrosion resistance than corrosion resistance of the metal material constituting the metal column.

7. The circuit module according to claim 2, the circuit module further comprising:
a covering film that at least partially covers a side surface of the second plating film,
wherein the second plating film is constituted of a metal material having higher ductility than ductility of the metal material constituting the metal column, and
the covering film is constituted of a metal material having higher ductility than the ductility of the metal material constituting the second plating film.

8. The circuit module according to claim 1,
wherein the surface of the first electronic component positioned on the opposite side from the surface on the side of the first electrode is configured of a polished cross section, and the outer surface of the first resin layer parallel to the one main surface of the substrate and the polished cross section of the first electronic component are flush with each other.

9. The circuit module according to claim 8, the circuit module further comprising:
a second electronic component mounted on the other main surface of the substrate, and
a second resin layer provided on the other main surface of the substrate and covering the second electronic component.

10. The circuit module according to claim 8,
wherein the second plating film is constituted of a metal material harder than a metal material constituting the metal column.

11. The circuit module according to claim 8,
wherein an interface of the first resin layer positioned between the first resin layer and the metal column is covered with a metal material having higher corrosion resistance than corrosion resistance of the metal material constituting the metal column.

12. The circuit module according to claim 8, the circuit module further comprising:
a covering film that at least partially covers a side surface of the second plating film,
wherein the second plating film is constituted of a metal material having higher ductility than ductility of the metal material constituting the metal column, and
the covering film is constituted of a metal material having higher ductility than the ductility of the metal material constituting the second plating film.

13. The circuit module according to claim 1, the circuit module further comprising:
a second electronic component mounted on the other main surface of the substrate, and
a second resin layer provided on the other main surface of the substrate and covering the second electronic component.

14. The circuit module according to claim 13,
wherein the second plating film is constituted of a metal material harder than a metal material constituting the metal column.

15. The circuit module according to claim 13,
wherein an interface of the first resin layer positioned between the first resin layer and the metal column is covered with a metal material having higher corrosion resistance than corrosion resistance of the metal material constituting the metal column.

16. The circuit module according to claim 13, the circuit module further comprising:
a covering film that at least partially covers a side surface of the second plating film,
wherein the second plating film is constituted of a metal material having higher ductility than ductility of the metal material constituting the metal column, and
the covering film is constituted of a metal material having higher ductility than the ductility of the metal material constituting the second plating film.

17. The circuit module according to claim 1,
wherein the second plating film is constituted of a metal material harder than a metal material constituting the metal column.

18. The circuit module according to claim 1,
wherein an interface of the first resin layer positioned between the first resin layer and the metal column is covered with a metal material having higher corrosion resistance than corrosion resistance of the metal material constituting the metal column.

19. The circuit module according to claim 1, the circuit module further comprising:
a covering film that at least partially covers a side surface of the second plating film,
wherein the second plating film is constituted of a metal material having higher ductility than ductility of the metal material constituting the metal column, and
the covering film is constituted of a metal material having higher ductility than the ductility of the metal material constituting the second plating film.

20. A method for manufacturing a circuit module including a substrate on one main surface of which a first electrode and a second electrode are provided, a first electronic component, and a first resin layer,
the first electrode including a first electrode base body, and a first plating film,
the second electrode including a second electrode base body, a metal column which is a sintered body of metal powder, a second plating film, and a covering portion,
the method for manufacturing a circuit module, comprising:
a first step of preparing or producing
first constraining layer green sheets each including a through-hole filled with a conductor paste containing the metal powder which serves as part of the metal column after sintering,
second constraining layer green sheets,
a first insulator green sheet to which a conductor paste which serves as the first electrode base body after sintering, a conductor paste which serves as the second electrode base body after sintering, and a conductor paste which serves as a constituent element of an electronic circuit after sintering are applied, and
second insulator green sheets to each of which a conductor paste which serves as a constituent element of the electronic circuit after sintering is applied;
a second step of producing a multilayer body by stacking and pressure-bonding
at least one of the first constraining layer green sheets,
at least one of the second constraining layer green sheets,
the first insulator green sheet, and
at least one of the second insulator green sheets,
in a state that positioning is performed such that a first constraining layer is present on the one main surface and a second constraining layer is present on another main surface of the substrate after sintering, and the metal column is directly connected onto the second electrode base body;
a third step of producing a sintered body, by firing the multilayer body, in which the substrate, the first constraining layer present on the one main surface of the substrate, and the second constraining layer present on the other main surface of the substrate are included, and the metal column formed by the metal powder being sintered is directly connected onto the second electrode base body;
a fourth step of removing the first constraining layer and the second constraining layer;
a fifth step of simultaneously forming the first plating film at least partially covering an outer surface of the first electrode base body and the second plating film at least partially covering an outer surface of a connection body of the second electrode base body and the metal column;
a sixth step of connecting the first electronic component to the first electrode;
a seventh step of providing the first resin layer on the one main surface of the substrate such that the first electronic component and the connection body after plating are entirely covered;
an eighth step of performing polishing process on the first electronic component and the first resin layer from a surface side positioned on an opposite side from a surface of the first electronic component on a side of the first electrode, such that a thickness of the first electronic component is reduced in comparison with a state before being connected to the first electrode, and an outer surface which is a polished cross section of the first resin layer parallel to the one main surface of the substrate, a polished cross section of the first electronic component, and a polished cross section of the connection body are flush with one another;
a ninth step of etching the polished cross section of the connection body such that a cross section being exposed of the connection body is positioned in an inner side portion relative to the outer surface of the first resin layer parallel to the one main surface of the substrate; and
a tenth step of forming the covering portion whose one main surface is connected onto the cross section of the connection body exposed after the etching and another main surface is positioned in an outer side portion relative to the outer surface of the first resin layer parallel to the one main surface of the substrate.

21. The method for manufacturing the circuit module according to claim 20,
wherein, in the first step, the through-hole included in the first constraining layer green sheets has a tapered shape, and
in the second step, the at least one of the first constraining layer green sheets is stacked and pressure-bonded such that an area of a cross section of the metal column orthogonal to a normal direction of the one main surface of the substrate after sintering is different from an area of a connection portion of the metal column and the second electrode base body.

\* \* \* \* \*